US012796079B2

(12) United States Patent
Lee et al.

(10) Patent No.: US 12,796,079 B2
(45) Date of Patent: Nov. 10, 2026

(54) SEMICONDUCTOR DEVICE

(71) Applicant: SAMSUNG ELECTRONICS CO., LTD., Suwon-si (KR)

(72) Inventors: Dae Seong Lee, Busan (KR); Ah Reum Kim, Daegu (KR); Min Su Kim, Hwaseong-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 19/077,880

(22) Filed: Mar. 12, 2025

(65) Prior Publication Data

US 2025/0212511 A1 Jun. 26, 2025

Related U.S. Application Data

(62) Division of application No. 17/680,907, filed on Feb. 25, 2022, now Pat. No. 12,272,694.

(30) Foreign Application Priority Data

May 20, 2021 (KR) ........................ 10-2021-0064722

(51) Int. Cl.
*H10D 84/90* (2025.01)

(52) U.S. Cl.
CPC ......... *H10D 84/907* (2025.01); *H10D 84/981* (2025.01)

(58) Field of Classification Search
CPC .... H10D 84/907; H10D 84/981; H10D 89/10; G06F 30/392; H10W 20/427
See application file for complete search history.

(56) References Cited

U.S. PATENT DOCUMENTS

| | | | | |
|---|---|---|---|---|
| 5,920,089 | A | 7/1999 | Kanazawa et al. | |
| RE43,912 | E | 1/2013 | Ogata | |
| 9,379,705 | B2 * | 6/2016 | Lee ................ | H03K 19/018507 |
| 9,483,600 | B2 | 11/2016 | Bansal et al. | |

(Continued)

FOREIGN PATENT DOCUMENTS

KR 1020090129351 A 12/2009

OTHER PUBLICATIONS

Office Action in Korean Appln. No. 10-2021-0064722, mailed on Apr. 29, 2025, 9 pages (with English translation).

(Continued)

*Primary Examiner* — Jason M Crawford
(74) *Attorney, Agent, or Firm* — Fish & Richardson P.C.

(57) ABSTRACT

A semiconductor device includes first, second, and third power rails extending in a first direction on a substrate and sequentially spaced apart in a second direction intersecting the first direction. A fourth power rail extends in the first direction on the substrate between the first and third power rails. A first well of a first conductive type is displaced inside the substrate between the first and third power rails. Cells are continuously displaced between the first and third power rails and share the first well. The first and third power rails are provided with a first voltage, the second power rail is provided with a second voltage different from the first voltage, the fourth power rail is provided with a third voltage different from the first voltage and the second voltage, and the cells are provided with the third voltage from the fourth power rail.

20 Claims, 14 Drawing Sheets

(56) References Cited

U.S. PATENT DOCUMENTS

| | | | | |
|---|---|---|---|---|
| 10,109,619 | B2 | 10/2018 | Pant et al. | |
| 10,740,531 | B2 * | 8/2020 | Yang | G06F 30/394 |
| 11,552,069 | B1 * | 1/2023 | Chang | G06F 1/3287 |
| 11,948,886 | B2 * | 4/2024 | Wu | H10D 84/0149 |
| 12,272,694 | B2 * | 4/2025 | Lee | H10D 84/907 |
| 2007/0241779 | A1 | 10/2007 | Ogata | |
| 2009/0079469 | A1 | 3/2009 | Ogata | |
| 2018/0145070 | A1 * | 5/2018 | Fan | H10D 84/83 |
| 2020/0373241 | A1 | 11/2020 | Gerousis et al. | |
| 2021/0044283 | A1 * | 2/2021 | Ryu | H03K 3/012 |
| 2021/0224458 | A1 * | 7/2021 | Guo | G06F 30/392 |
| 2021/0343744 | A1 * | 11/2021 | Chiu | H03K 3/0372 |
| 2021/0358848 | A1 * | 11/2021 | Wu | H10D 84/0186 |
| 2022/0130760 | A1 * | 4/2022 | Wu | H10D 84/0149 |
| 2022/0375963 | A1 * | 11/2022 | Lee | H10D 84/907 |
| 2023/0064108 | A1 * | 3/2023 | Chang | H10D 89/10 |
| 2023/0402461 | A1 * | 12/2023 | Chiu | H03K 3/35625 |
| 2024/0145343 | A1 * | 5/2024 | Park | H10D 89/10 |
| 2024/0258236 | A1 * | 8/2024 | Takeno | H10W 20/20 |
| 2024/0413160 | A1 * | 12/2024 | Kim | H10D 84/907 |
| 2025/0212511 | A1 * | 6/2025 | Lee | H10D 84/907 |

OTHER PUBLICATIONS

Notice of Allowance in Korean Appln. No. 10-2021-0064722, mailed on Dec. 30, 2025, 4 pages (with machine translation).

* cited by examiner

SEMICONDUCTOR DEVICE

CROSS-REFERENCE TO RELATED APPLICATIONS

This application is a divisional application of and claims the benefit of priority to U.S. application Ser. No. 17/680,907, filed on Feb. 25, 2022, which claims priority under 35 U.S.C. § 119 to Korean Patent Application No. 10-2021-0064722 filed on May 20, 2021, in the Korean Intellectual Property Office, the subject matter of which is hereby incorporated by reference.

BACKGROUND

1. Field of the Disclosure

The disclosure relates to a semiconductor device.

2. Description of the Related Art

It is important to reduce an area of an IC (Integrated Circuit) such as an SoC (System-on-Chip) which is often used in a mobile device in terms of productivity of the mobile device. On the other hand, an improvement in performance of the IC with the increased demand of a user also corresponds to another important aspect.

In order to improve a cell performance of the IC and minimize an area thereof, there is a need for design of a layout of a semiconductor circuit (e.g., a standard cell) for implementing all the semiconductor elements necessary for performance improvement and maintaining a small area at the same time.

SUMMARY

Embodiments of the disclosure provide a semiconductor device having a reduced area and improved metal wiring.

In one aspect, embodiments of the disclosure provide A semiconductor device comprising: a first power rail, a second power rail, and a third power rail which extend in a first direction on a semiconductor substrate, and are sequentially spaced apart from each other in a second direction intersecting the first direction; a single fourth power rail which extends in the first direction on the semiconductor substrate between the first power rail and the third power rail; a first well of a first conductive type which is placed displaced inside the semiconductor substrate between the first power rail and the third power rail; and a plurality of cells which are continuously placed displaced between the first power rail and the third power rail and share the first well, wherein the first power rail and the third power rail are provided with a first voltage, the second power rail is provided with a second voltage that is different from the first voltage, the single fourth power rail is provided with a third voltage that is different from the first voltage and the second voltage, and the plurality of cells are provided with the third voltage from the single fourth power rail.

In another aspect, embodiments of the disclosure provide a semiconductor device comprising: a first power rail, a second power rail, and a third power rail which extend in a first direction on a semiconductor substrate and are sequentially spaced apart from each other in a second direction intersecting the first direction; a single fourth power rail which extends in the first direction on the semiconductor substrate between the first power rail and the third power rail; a first well of a first conductive type which is displaced inside the semiconductor substrate between the first power rail and the third power rail; a plurality of the first cells in which cell boundaries are defined by the first power rail and the second power rail, and which are placed continuously; and a plurality of second cells in which cell boundaries are defined by the second power rail and the third power rail, and which are placed continuously, wherein the first power rail and the third power rail are provided with a first voltage, the second power rail is provided with a second voltage that is different from the first voltage, the single fourth power rail is provided with a third voltage that is different from the first voltage and the second voltage, and the plurality of first cells and the plurality of second cells share the first well and are provided with the third voltage from the single fourth power rail.

In still another aspect, embodiments of the disclosure provide a semiconductor device comprising: a first power rail and a second power rail which extend in a first direction on a semiconductor substrate, and are sequentially spaced apart from each other in a second direction intersecting the first direction; a single third power rail which extends in the first direction on the semiconductor substrate between the first power rail and the second power rail; a first well of an N type which is placed displaced inside the semiconductor substrate between the first power rail and the second power rail; and a plurality of cells which are arranged between the first power rail and the second power rail in two rows and share the first well, wherein the first power rail and the second power rail are provided with a first voltage, the third power rail is provided with a second voltage that is different from the first voltage, each of the plurality of cells includes a PMOS transistor placed displaced on the first well, and the PMOS transistor is provided with the second voltage from the single third power rail.

However, the scope of the disclosure is not limited to only the aspects summarized above. Rather, other aspects and features of the disclosure will become more apparent to those skilled in the art upon consideration of the following detailed description together with the accompanying drawings.

BRIEF DESCRIPTION OF THE DRAWINGS

The making and use of the disclosure may be understood upon consideration of the certain embodiments illustrated in the accompanying drawings, in which.

DETAILED DESCRIPTION OF THE EMBODIMENTS

Figure 1:
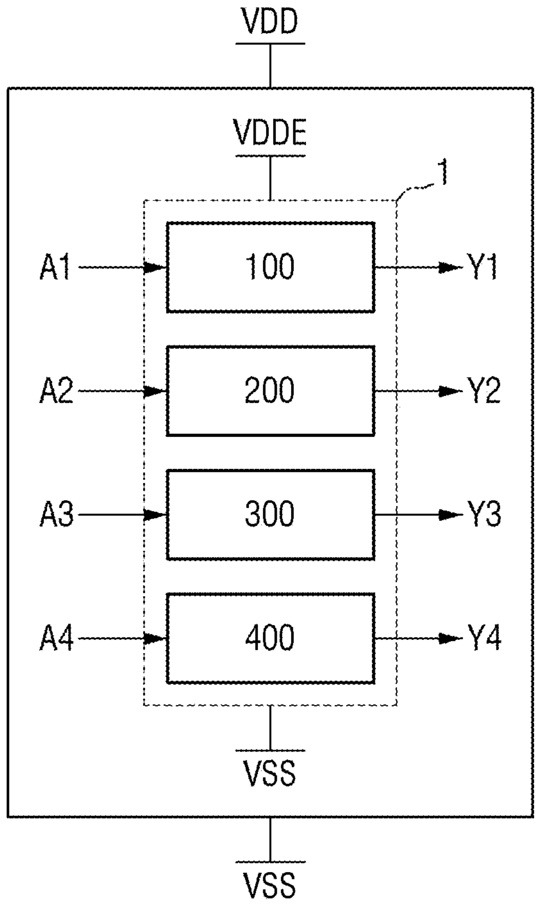
FIG. 1 is a block diagram of a semiconductor device according to some embodiments.

FIG. 1 is a block diagram of a semiconductor device according to some embodiments.

Referring to FIG. 1, the semiconductor device according to some embodiments may be provided with a second voltage VDD to operate. Current flowing through the semiconductor device may flow from the second voltage VDD to a first voltage VSS. For example, the first voltage VSS may be a ground voltage and the second voltage VDD may be a first supply voltage.

The semiconductor device may include a circuit 1 that is provided with a third voltage VDDE to operate. The current flowing through the circuit 1 may flow from the third voltage VDDE to the first voltage VSS. The third voltage VDDE may be a second supply voltage different from the second voltage VDD. That is, the semiconductor device may include portions that utilize different voltages from each other. The portions that utilize different voltages from each other need to be separated from each other for a stable operation and may be separated by dummy regions. When the semiconductor device is placed on the semiconductor substrate, an unnecessary area may be included due to such dummy regions. However, in the semiconductor device according to some embodiments, the area of the semiconductor device may be reduced by merging and selectively placing the portions that are provided with the third voltage VDDE. This will be described in detail below.

The circuit 1 may receive an input signal of multi-bit and output it as an output signal of multi-bit. The circuit 1 may process the input signals corresponding to each bit in parallel. The circuit 1 may process, for example, an input signal of 4 bits and may include first to fourth circuits 100, 200, 300 and 400 that operate in parallel with each other.

A first circuit 100 may receive a first input signal A1 corresponding to 1 bit and output a first output signal Y1 corresponding to 1 bit. A second circuit 200 may receive a second input signal A2 corresponding to 2 bits and output a second output signal Y2 corresponding to 2 bits. A third circuit 300 may receive a third input signal A3 corresponding to 3 bits and output a third output signal Y3 corresponding to 3 bits. A fourth circuit 400 may receive a fourth input signal A4 corresponding to 4 bits and output a fourth output signal Y4 corresponding to 4 bits.

Each of the first to fourth circuits 100, 200, 300 and 400 may include, for example, any one of an inverter, a circuit that performs a NAND computation, and a circuit that performs a NOR computation. Each of the first to fourth circuits 100, 200, 300 and 400 may include, for example, a plurality of inverters.

Figure 2:
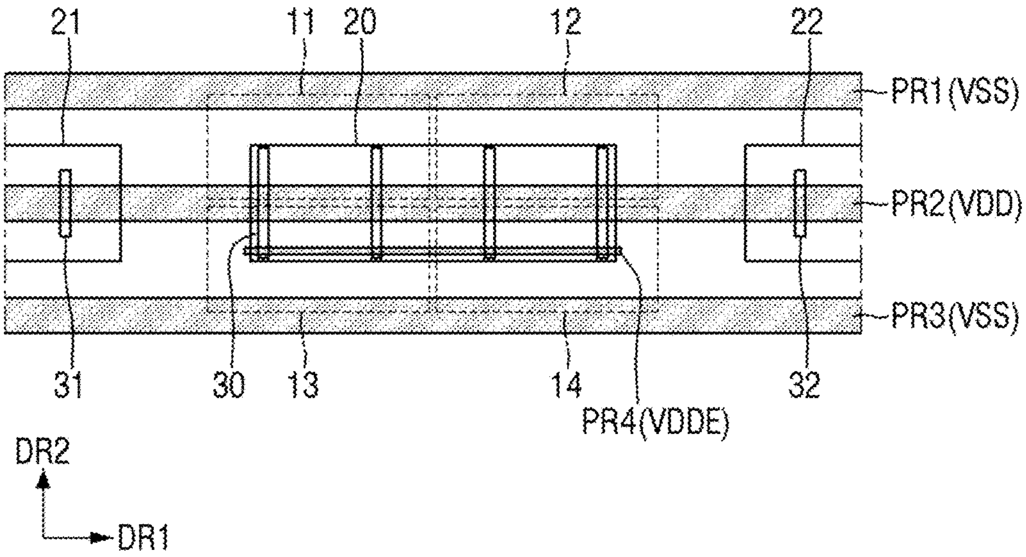
FIG. 2 is a layout diagram for explaining a circuit of FIG. 1.

FIG. 2 is a layout diagram for explaining the circuit of FIG. 1.

Referring to FIGS. 1 and 2, the circuit 1 may be formed on the substrate. First to third power rails PR1, PR2 and PR3 may extend in a first direction DR1. The first to third power rails PR1, PR2 and PR3 may be sequentially spaced apart from each other in a second direction DR2 that intersects the first direction DR1. The first power rail PR1 and the third power rail PR3 may be provided with the first voltage VSS, and the second power rail PR2 may be provided with the second voltage VDD different from the first voltage. For example, the first voltage VSS may be a ground voltage, and the second voltage VDD may be a first supply voltage.

A first cell 11 and a second cell 12 may be continuously placed between the first power rail PR1 and the second power rail PR2. The first cell 11 and the second cell 12 may be arranged in the first direction DR1. Cell boundaries of the first cell 11 and the second cell 12 may be defined by the first power rail PR1 and the second power rail PR2. A third cell 13 and a fourth cell 14 may be continuously arranged between the second power rail PR2 and the third power rail PR3. The third cell 13 and the fourth cell 14 may be arranged in the first direction DR1. Cell boundaries of the third cell 13 and the fourth cell 14 may be defined by the second power rail PR2 and the third power rail PR3.

Each of the first to fourth circuits 100, 200, 300 and 400 may be placed, for example, in each of the first to fourth cells 11 to 14, respectively. For example, the first circuit 100 may be placed in the first cell 11, the second circuit 200 may be placed in the second cell 12, the third circuit 300 may be placed in the third cell 13, and the fourth circuit 400 may be placed in the fourth cell 14. However, the present disclosure is not limited thereto.

A fourth power rail PR4 may be placed between the first power rail PR1 and the third power rail PR3. The fourth power rail PR4 may extend in the first direction DR1. The fourth power rail PR4 may be spaced apart from the first power rail PR1 and the third power rail PR3 in the second direction DR2. The fourth power rail PR4 may be placed between the second power rail PR2 and the third power rail PR3 as shown in the drawings. Alternatively, the fourth power rail PR4 may also be placed between the first power rail PR1 and the second power rail PR2.

The fourth power rail PR4 may be placed on a first well 20. The fourth power rail PR4 may be provided with the third voltage VDDE. The third voltage VDDE may be a second supply voltage different from the second voltage VDD.

The first well 20 may be placed inside a semiconductor substrate between the first power rail PR1 and the second power rail PR2. The first well 20 may extend in the first direction DR1. The first well 20 may have a first conductive type. The first conductive type may be, for example, an N type.

A first connection line 30 may be connected to the fourth power rail PR4 and extend in the second direction DR2. A portion of the first well 20 connected to the first connection line 30 may be provided with the third voltage VDDE from the first connection line 30.

The first to fourth cells 11 to 14 may share the first well 20. At least some of the first to fourth cells 11 to 14 may be placed on the first well 20. A PMOS transistor included in the first to fourth cells 11 to 14 may be placed on the first well 20. The PMOS transistor included in the first to fourth cells 11 to 14 may be connected to the first connection line 30, which may be connected to the fourth power rail PR4, and provided with the third voltage VDDE.

A first dummy well 21 may be placed on one side of the first well 20. A second dummy well 22 may be placed on the other side of the first well 20. Here, one side and the other side of the first well 20 may be based on the first direction DR1. That is, the first dummy well 21, the first well 20, and the second dummy well 22 may be arranged sequentially in the first direction DR1. Therefore, the first well 20 may be isolated by the first dummy well 21 and the second dummy well 22.

A second connection line 31 may be connected to the second power rail PR2 and extend in the second direction DR2. The first dummy well 21 may be connected to the second connection line 31 and be provided with the second voltage VDD. A third connection line 32 may be connected to the second power rail PR2 and extend in the second direction DR2. The second dummy well 22 may be connected to the third connection line 32 and be provided with the second voltage VDD.

If the firth to fourth cells 11 to 14 do not share the first well 20 and each include a first well, there is a need for a dummy well for isolating each of the first wells. However, in the semiconductor device according to some embodiments, the first to fourth cells 11 to 14 may be placed to share the first well 20. Accordingly, since the number and/or area of the first well 20 may decrease, and the number and/or area of the dummy wells for isolating the first well 20 may also decrease, an area of the semiconductor device may decrease.

FIGS. 3 to 8 are exemplary circuit diagrams of the first circuit of FIG. 1. The first to fourth circuits 100, 200, 300 and 400 may have, for example, the same configuration, and FIGS. 3 to 8 may be exemplary circuit diagrams of the first to fourth circuits 100, 200, 300 and 400 of FIG. 1. For convenience of explanation, the first circuit 100 will be mainly described.

Figure 3:
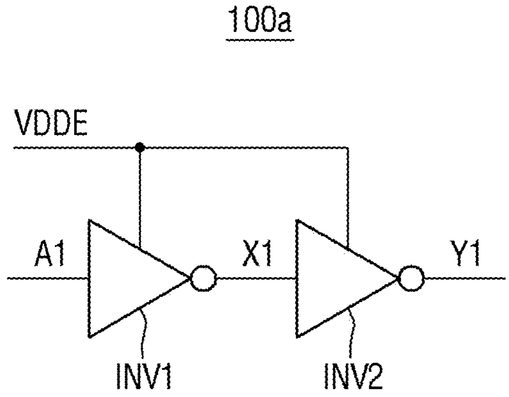
FIGS. 3 to 8 are exemplary circuit diagrams of a first circuit of FIG. 1.
Figure 4:
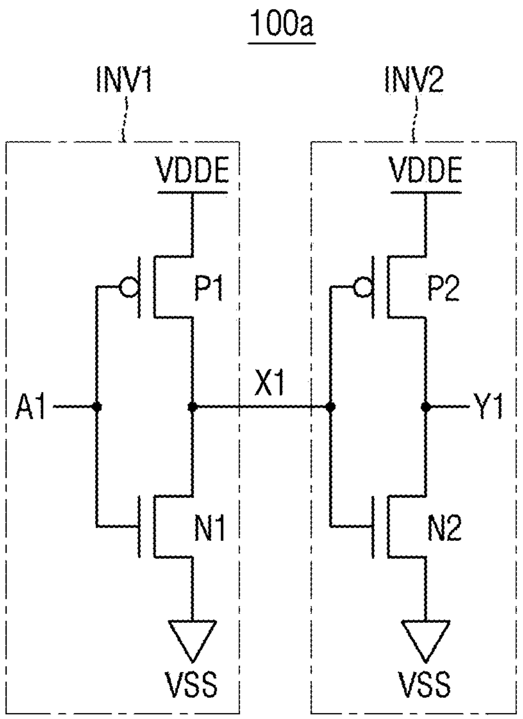

Referring to FIGS. 3 and 4, a first circuit 100*a* may include a plurality of inverters. For example, the first circuit 100*a* may include a first inverter INV1 and a second inverter INV2. The first inverter INV1 may be provided with the first input signal A1 and invert it to generate an inverted first input signal X1. The first inverter INV1 may output the inverted first input signal X1. The second inverter INV2 may be provided with the inverted first input signal X1 and invert it to generate a first output signal Y1. The second inverter INV2 may output the first output signal Y1.

The first inverter INV1 may include a first PMOS transistor P1 and a first NMOS transistor N1, and the second inverter INV2 may include a second PMOS transistor P2 and a second NMOS transistor N2. The first PMOS transistor P1 and the first NMOS transistor N1 may be connected in series between the third voltage VDDE and the first voltage VSS. The second PMOS transistor P2 and the second NMOS transistor N2 may be connected in series between the third voltage VDDE and the first voltage VSS. The first PMOS transistor P1 and the first NMOS transistor N1 may be gated to a voltage level of the first input signal A1, and the second PMOS transistor P2 and the second NMOS transistor N2 may be gated to a voltage level of the inverted first input signal X1. The third voltage VDDE may correspond to a high voltage level defined by a voltage level logic with which the first input signal A1 complies.

Figure 5:
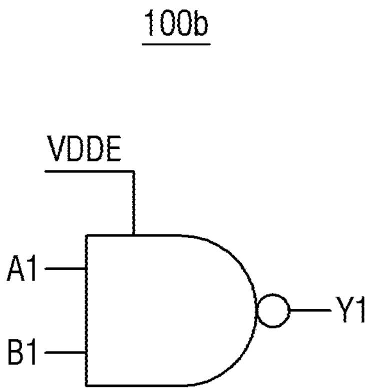
Figure 6:
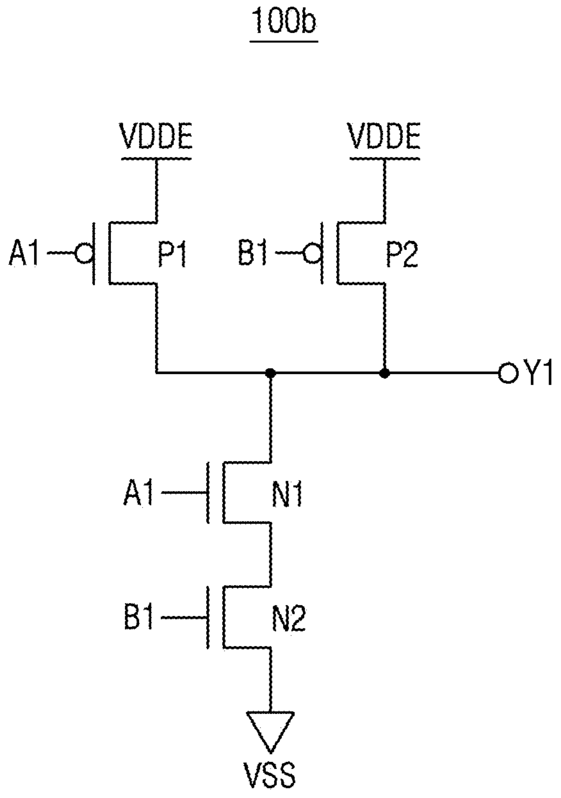

Referring to FIGS. 5 and 6, a first circuit 100*b* may be a circuit that performs a NAND computation and may be provided with a first-1 input signal A1 and a first-2 input signal B1 and perform NAND computation thereof to generate a first output signal Y1. The first circuit 100*b* may output the first output signal Y1.

A first PMOS transistor P1 and A first NMOS transistor N1 may be gated to a voltage level of a first-1 input signal A1, and a second PMOS transistor P2 and a second NMOS transistor N2 may be gated to a voltage level of a first-2 input signal B1. The first and second transistors P1 and P2 may be placed on the first well 20 of FIG. 2 and provided with the third voltage VDDE from the first connection line 30.

Figure 7:
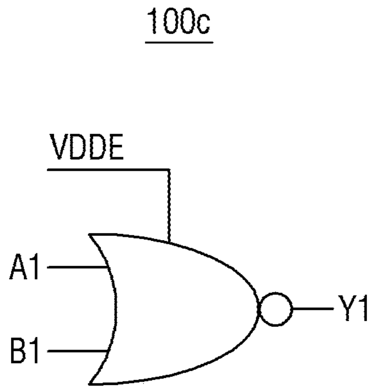
Figure 8:
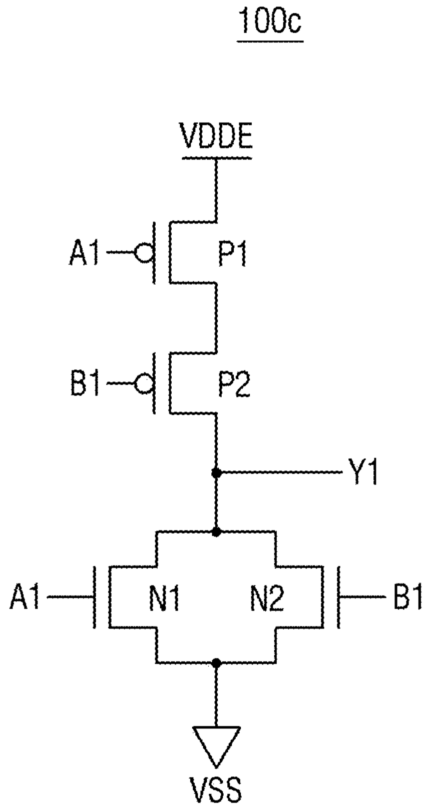

Referring to FIGS. 7 and 8, a first circuit 100*c* may be a circuit that performs a NOR computation and may be provided with the first-1 input signal A1 and the first-2 input signal B1 and perform the NOR computation thereof to generate the first output signal Y1. The first circuit 100*c* may output the first output signal Y1.

A first PMOS transistor P1 and the a NMOS transistor N1 may be gated to the voltage level of the first and first-1 input signals A1, and a second PMOS transistor P2 and a second NMOS transistor N2 may be gated to the voltage level of the first-2 input signal B1. The first and second transistors P1 and P2 may be placed on the first well 20 of FIG. 2 and provided with the third voltage VDDE from the first connection line 30.

Figure 9:
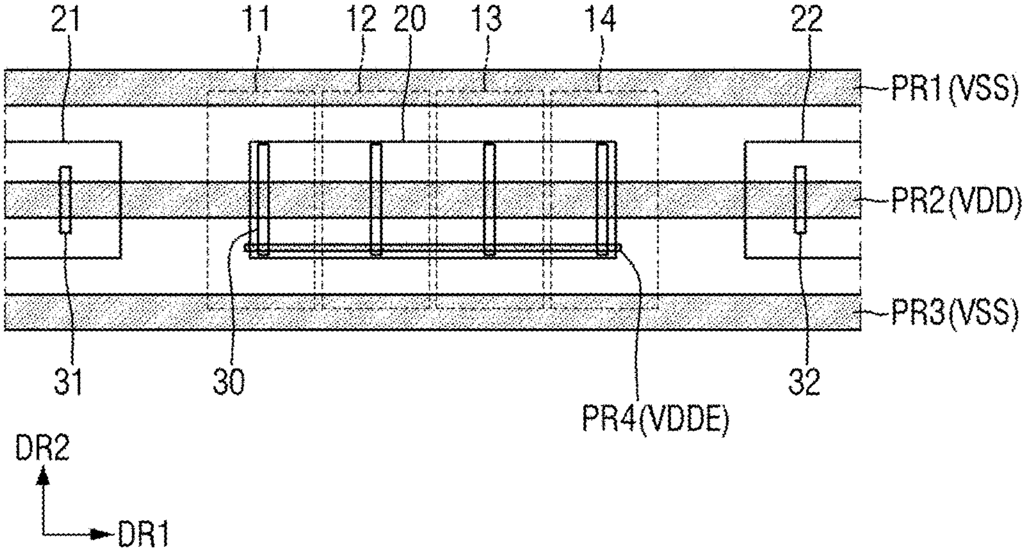
FIG. 9 is a layout diagram for explaining the circuit of FIG. 1.

FIG. 9 is a layout diagram for explaining the circuit of FIG. 1. For convenience of explanation, points different from FIG. 2 will be mainly described.

Referring to FIGS. 1 and 9, the circuit 1 may be formed on the semiconductor substrate. The first to fourth cells 11 to 14 may be continuously placed between the first power rail PR1 and the third power rail PR3. The first to fourth cells 11 to 14 may be arranged in the first direction DR1. Cell boundaries of the first to fourth cells 11 to 14 may be defined by the first power rail PR1 and the third power rail PR3. For example, the height of the first to fourth cells 11 to 14 of FIG. 9 may be twice the height of the first to fourth cells 11 to 14 of FIG. 2.

Each of the first to fourth circuits 100, 200, 300 and 400 may be placed in each of the first to fourth cells 11 to 14, respectively.

The first and second PMOS transistors P1 and P2 of FIGS. 3 to 8 may be placed on the first well 20. The first and second PMOS transistors P1 and P2 of FIGS. 3 to 8 may be connected to the first connection line 30, which may be connected to the fourth power rail PR4, and be provided with the third voltage VDDE.

Figure 10:
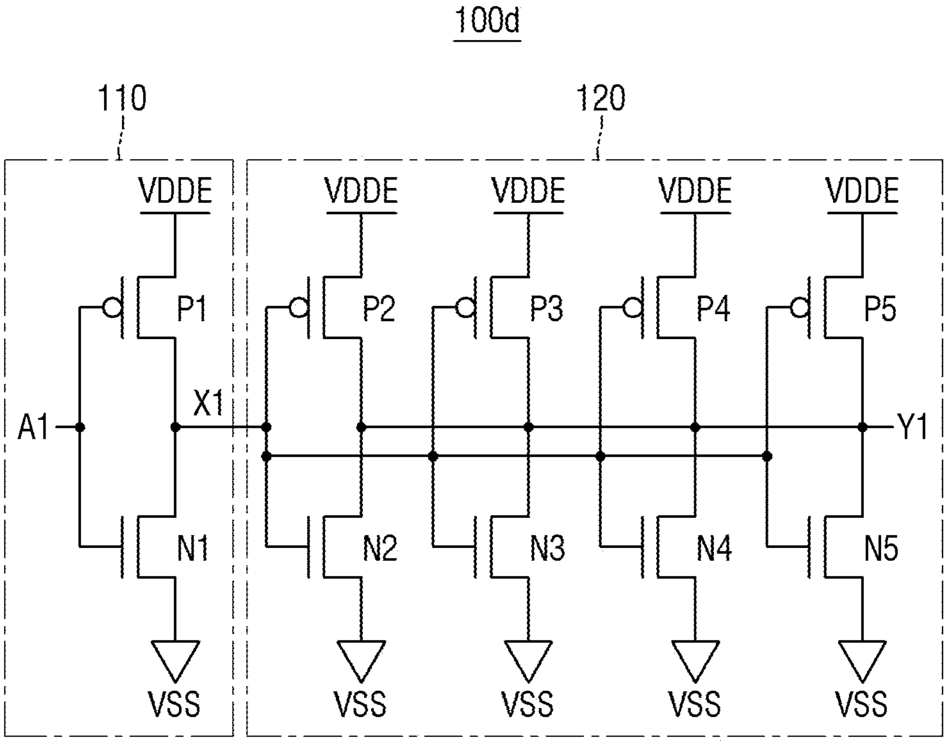
FIG. 10 is an exemplary circuit diagram of the first circuit placed in a first cell of FIG. 9.
Figure 11:
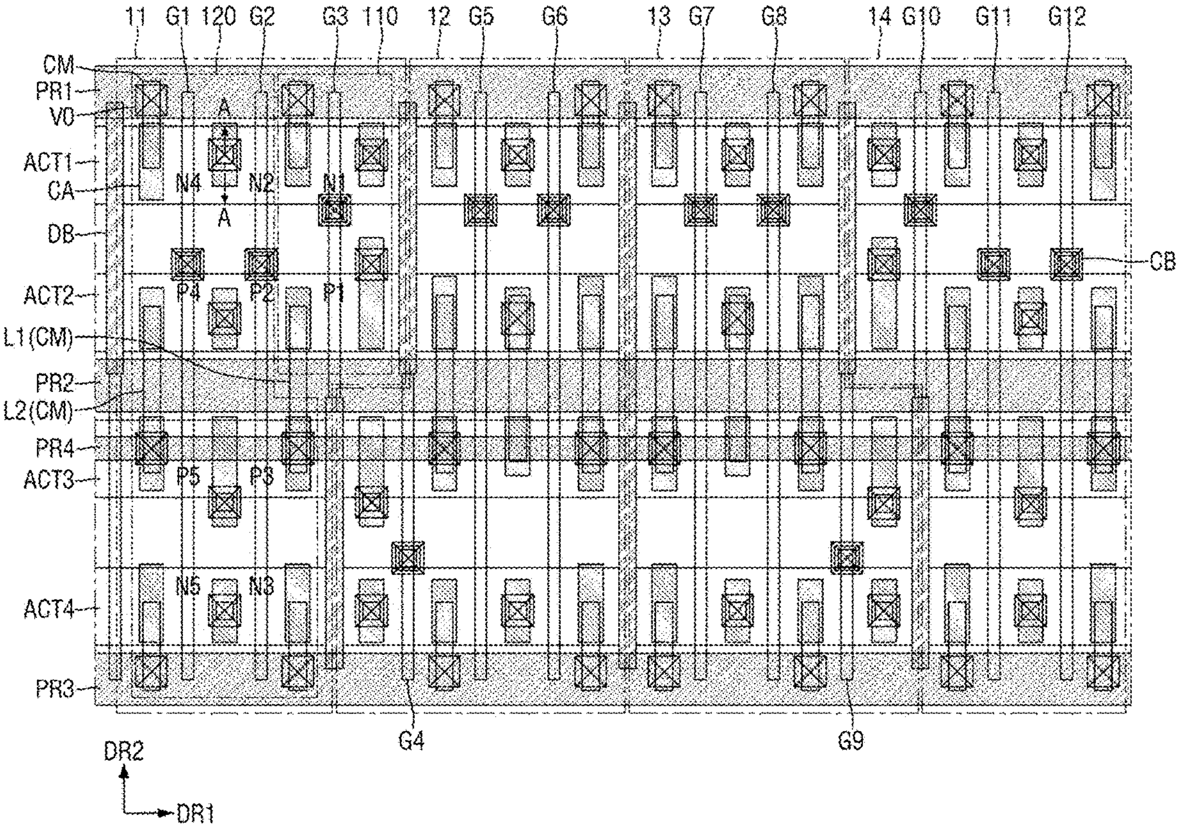
FIGS. 11 to 13 are layout diagrams for explaining the circuit of FIG. 9.
Figure 12:
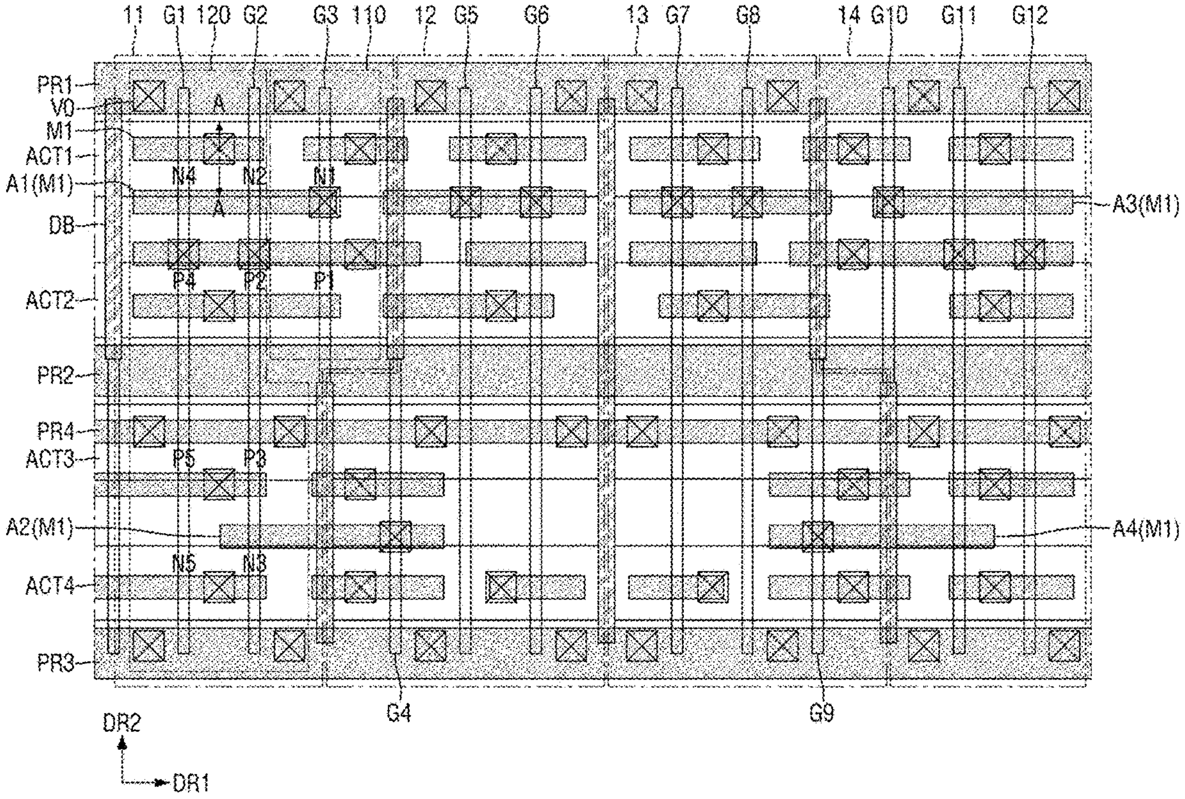
Figure 13:
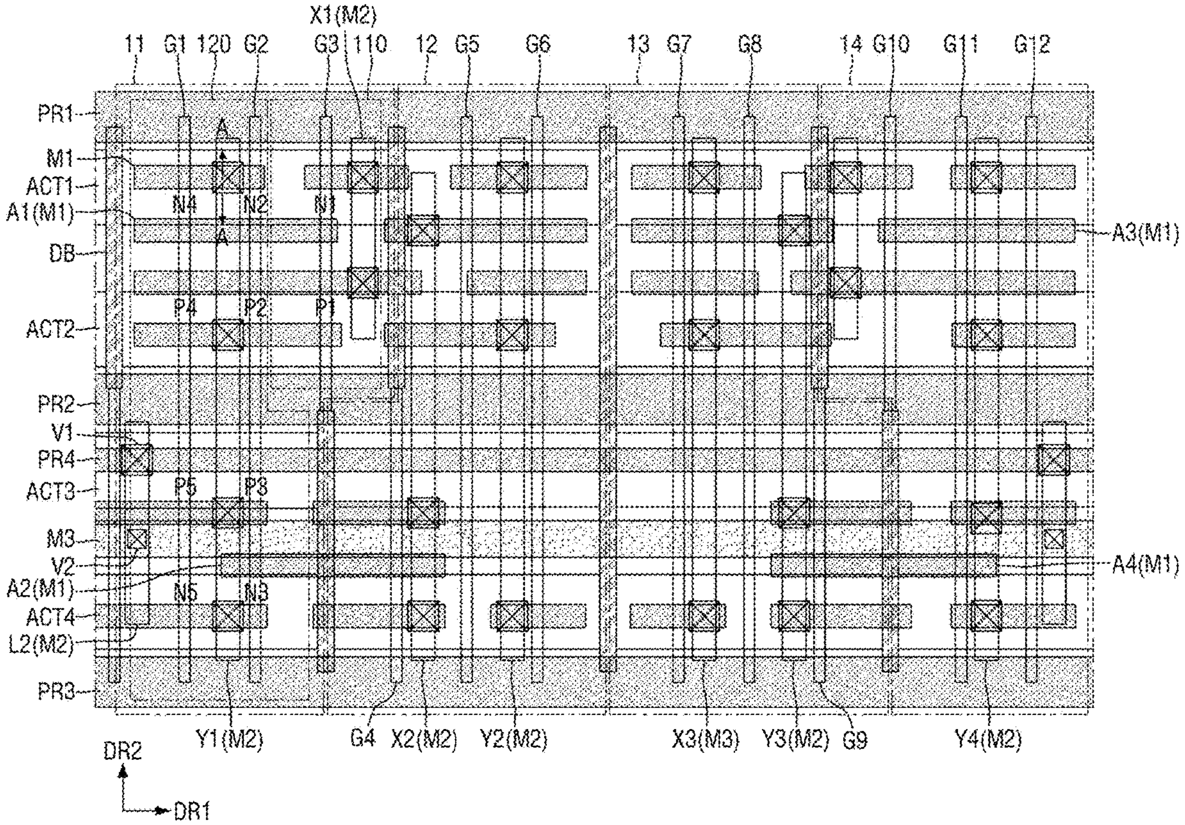
Figure 14:
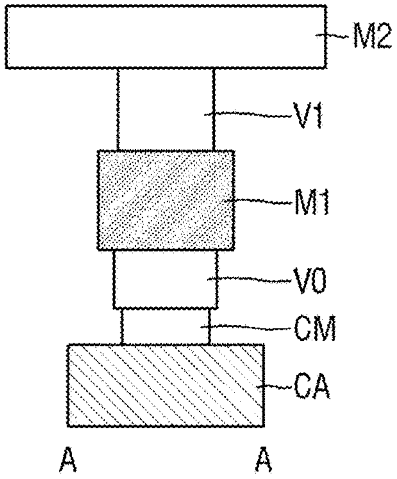
FIG. 14 is a cross-sectional view taken along A-A in FIGS. 11 to 13.

FIG. 10 is an exemplary circuit diagram of a first circuit placed in the first cell of FIG. 9. FIGS. 11 to 13 are layout diagrams for explaining the circuit of FIG. 9. FIG. 14 is a cross-sectional view taken along A-A in FIGS. 11 to 13. FIG. 11 is a layout diagram which shows gate lines G1 to G12, a source/drain contact CA, a gate contact CB, a contact line CM, a contact via V0, and the first to fourth power rails PR1, PR2, PR3 and PR4. FIG. 12 is a diagram showing a contact via V0 and a first metal line M1. FIG. 13 is a diagram showing a first metal line M1, a first via V1, a second metal line M2, a second via V2, and a third metal line M3.

Referring to FIGS. 10 and 13, a first circuit 100*d* placed on the first cell 11 may include a first-1 circuit 110 and a first-2 circuit 120. The first first-1 circuit 110 may be provided with the first input signal A1 and invert it to generate an inverted first input signal X1. The first-2 circuit 120 may be provided with the inverted first input signal X1 and invert it to generate a first output signal Y1. The first circuit 100 may output the first output signal Y1.

The first-1 circuit 110 may include a first PMOS transistor P1 and a first NMOS transistor N1 that are gated to the voltage level of the first-1 input signal A1 and connected in series between the third voltage VDDE and the first voltage VSS.

The first-2 circuit 120 may include a plurality of pairs of NMOS transistors and PMOS transistors that are gated to the voltage level of the inverted first input signal X1 and connected in series between the third voltage VDDE and the first voltage VSS. For example, the first-2 circuit 120 may include a second PMOS transistor P2 and a second NMOS transistor N2, a third PMOS transistor P3 and a third NMOS transistor N3, a fourth PMOS transistor P4 and a fourth NMOS transistor N4, and a fifth PMOS transistor P5 and a fifth NMOS transistor N5, which are gated to the voltage level of the inverted first input signal X1 and connected in series between the third voltage VDDE and the first voltage VSS. That is, for example, although the first-2 circuit 120 may include four pairs of NMOS transistors and PMOS transistors, the present disclosure is not limited thereto.

The second circuit 200 placed on the second cell 12, the third circuit 300 placed on the third cell 13, and the fourth circuit 400 placed on the fourth cell may have the same configuration as the first circuit 100*d*. The second circuit 200 includes a second-1 circuit, which is provided with a second input signal A2 and outputs an inverted second input signal X2, and may be provided with a second-2 circuit that receives the inverted second input signal X2 and inverts it to generate and output a second output signal Y2. The third circuit 300 includes a third-1 circuit, which is provided with a third input signal A3 and outputs the inverted third input signal X3, and may be provided with a third-2 circuit that receives the inverted third input signal X3 and inverts it to generate and output a third output signal Y3. The fourth circuit 400 includes a fourth-1 circuit, which is provided with the fourth input signal A4 and outputs the inverted fourth input signal X4, and may be provided with a fourth-2 circuit that receives the inverted fourth input signal X4 and inverts it to generate and output a fourth output signal Y4.

Referring to FIG. 11, the semiconductor substrate may include the first to fourth active regions ACT1 to ACT4. The first to fourth active regions ACT1 to ACT4 may extend in the first direction DR1. The first active region ACT1 and the second active region ACT2 may be defined between the first power rail PR1 and the second power rail PR2, the first active region ACT1 may be adjacent to the first power rail PR1, and the second active region ACT2 may be adjacent to the second power rail PR2. The third active region ACT3 and the fourth active region ACT4 may be defined between the second power rail PR2 and the third power rail PR3, the third active region ACT3 may be adjacent to the second power rail PR2, and the fourth active region ACT4 may be adjacent to the third power rail PR3. An element separation region may be formed between the first to fourth active patterns ACT1 to ACT4.

In some examples, the first and fourth active regions ACT1 and ACT4 may be regions including N type impurities and the second and third active regions ACT2 and ACT3 may be regions including P type impurities. Therefore, the NMOS transistor may be formed on the first and fourth active regions ACT1 and ACT4 and the second and third active regions ACT2 and ACT3 may be regions including P type impurities. The second and third active regions ACT2 and ACT3 may be placed on the first well 20 of the first conductive type (e.g., N type).

In some embodiments, the transistors formed in the first to fourth active regions ACT1 to ACT4 may be fin-type transistors (FinFET) that include a channel region of a fin-type pattern. Alternatively, it is a matter of course that the transistors formed in the first to fourth active regions ACT1 to ACT4 may include a tunneling FET, a transistor including nanowires, a transistor including nanosheets, a VFET (Vertical FET), a CFET (Complementary FET) or a three-dimensional (3D) transistor. Further, the transistors formed in the first to fourth active regions ACT1 to ACT4 may include a bipolar junction transistor, a lateral double diffused metal oxide (LDMOS), and the like.

First to twelfth gate lines G1 to G12 may extend in the second direction DR2. The first to twelfth gate lines G1 to G12 may be spaced apart from each other in the first direction DR1. The first, second, fifth, sixth, seventh, eighth, tenth, eleventh and twelfth gate lines G1, G2, G5, G6, G7, G8, G10, G11 and G12 may intersect the first to fourth active patterns ACT1 to ACT4. The third and tenth gate lines G3 and G10 may intersect the first and second active patterns ACT1 and ACT, and the fourth and ninth gate lines G4 and G9 may intersect the third and the fourth active pattern ACT3 and ACT4.

A diffusion brake DB may extend in the second direction DR2. The diffusion brake DB may cut and separate the first to fourth active patterns ACT1 to ACT4. Although the diffusion brake DB may be, for example, a single diffusion brake, the present disclosure is not limited thereto.

The diffusion brake DB may be placed on an extension of the third gate line G3 in the second direction DR2 between the second gate line G2 and the fourth gate line G4, on an extension of the fourth gate line G4 in the second direction DR2 between the third gate line G3 and the fifth gate line G5, on an extension of the ninth gate line G9 in the second direction DR2 between the sixth and seventh gate lines G6 and G7 and between the eighth gate line G8 and the tenth gate line G10, and on an extension of the tenth gate line G10 in the second direction DR2 between the ninth gate line G9 and the eleventh gate line G11. The first to fourth cells 11 to 14 may be insulated by the diffusion brake DB.

Referring to FIG. 14, the source/drain contact CA, the contact line CM, the contact via V0, the first metal line M1, the first via V1 and the second metal line M2 may be sequentially stacked. That is, the source/drain contact CA, the contact line CM, the contact via V0, the first metal line M1, the first via V1 and the second metal line M2 may be formed at different metal levels from each other. The source/drain contact CA, the contact line CM, the contact via V0, the first metal line M1, the first via V1 and the second metal line M2 may be formed sequentially at higher metal levels. The first to fourth power rails PR1, PR2 and PR3, PR4 may be formed at the same metal level as the first metal line M1.

For convenience of the description, the first cell 11 will be mainly described below. Referring to FIGS. 10 to 13 again, the first gate line G1 may overlap the first active region ACT1 to form the fourth NMOS transistor N4. The first gate line G1 may overlap the second active region ACT2 to form the fourth PMOS transistor P4. The first gate line G1 may overlap the third active region ACT3 to form the fifth PMOS transistor P5. The first gate line G1 may overlap the fourth active region ACT4 to form the fifth NMOS transistor N5. The second gate line G2 may overlap each of the first to fourth active regions ACT1 to ACT4 to form the second NMOS transistor N2, the second PMOS transistor P2, the third PMOS transistor P3 and the third NMOS transistor N3, respectively. The third gate line G3 may overlap each of the first and second active regions ACT1 and ACT2 to form the first NMOS transistor N1 and the first PMOS transistor P1, respectively.

The first and second NMOS transistors N1 and N2 may share the source region. The second and fourth NMOS transistors N2 and N4 may share the drain region. The first and second PMOS transistors P1 and P2 may share the source region. The second and fourth PMOS transistors P2 and P4 may share the drain region. The third and fifth PMOS transistors P3 and P5 may share the drain region. The third and fifth NMOS transistors N3 and N5 may share the drain region.

The source regions of the first, second and fourth NMOS transistors N1, N2 and N4 may be provided with the first voltage VSS through the first power rail PR1, the contact line CM connected to the first power rail PR1 through the contact via V0, and the source/drain contact CA connected to the contact line CM. The contact line CM may extend in the second direction DR2. The source regions of the third and fifth NMOS transistors N3 and N5 may be provided with the first voltage VSS through the third power rail PR3, the contact line CM connected to the third power rail PR3 through the contact via V0, and the source/drain contact CA connected to the contact line CM.

The source regions of the first to fifth PMOS transistors P1 to P5 may be provided with the third voltage VDDE through the fourth power rail PR4, the contact line CM connected to the fourth power rail PR4 through the contact via V0, and the source/drain contact CA connected to the contact line CM. For example, the source regions of the first to third PMOS transistors P1, P2 and P3 may share the first contact line L1, and the source regions of the fourth and fifth PMOS transistors P4 and P5 may share the second contact line L2. The source regions of the first to third PMOS transistors may be provided with the third voltage VDDE through the first contact line L1, and the source regions of the fourth and fifth PMOS transistors may be provided with the third voltage VDDE through the second contact line L2. The first connection line 30 of FIG. 2 may correspond to a path from the fourth power rail PR4 of FIGS. 10 to 13 to the contact via V0, the contact line CM and the source/drain contact CA.

The fourth power rail PR4 may be connected to the second metal line M2 through the first via V1. The second metal line M2 may be placed above the fourth power rail PR4. The second metal line M2 may extend in the second direction DR2. The third metal line M3 may be connected to the third metal line M3 through the second via V2. The third metal line M3 may be placed above the second metal line M2. The third metal line M3 may extend in the first direction DR1.

The semiconductor device according to some embodiments may include a single fourth power rail PR4, and the source regions of the PMOS transistors P1 to P5 included in the first to fourth cells 11 to 14 may be provided with the third voltage VDDE from the single fourth power rail PR4. That is, the source regions of the PMOS transistors P1 to P5 placed in the second active region ACT2 and the third active region ACT3 may share the single fourth power rail PR4. Therefore, because a metal track may decrease compared to a case where power rails—for providing the third voltage VDDE to each of the source regions of the PMOS transistors P1 to P3 placed in the second active region ACT2 and the source regions of the transistors P3 and P5 placed in the third active region ACT3—are formed for each row, metal routing may be improved.

The third gate line G3 may be provided with the first input signal A1 through the first metal line M1, the contact line CM connected to the first metal line M1 through the contact via V0, and the gate contact CB connected to the contact line CM. The first NMOS transistor N1 and the first PMOS transistor P1, which are gated to the voltage level of the first input signal A1, may be provided with the first input signal A1 through the third gate line G3. The first NMOS transistor N1 and the first PMOS transistor P1 may share the third gate line G3.

The drain region of the first NMOS transistor N1 and the drain region of the first PMOS transistor P1 may be connected to each other through the source/drain contact CA, the contact line CM connected to the source/drain contact CA, the first metal line M1 connected to the contact line CM through the contact via V0, and the second metal line M2 connected to the first metal line M1 through the first via V1 to output the inverted first input signal X1.

The first gate line G1 and the second gate line G2 may be provided with the inverted first input signal X1 through the second metal line M2, the first metal line M1 connected to the second metal line M2 through the first via V1, the contact line CM connected to the first metal line M1 through the contact via V0, and the gate contact CB connected to the contact line CM. The second and third NMOS transistors N2 and N3 and the second and third PMOS transistors P2 and P3, which are gated to the voltage level of the inverted first input signal X1, may be provided with the inverted first input signal X1 through the second gate line G2. The second and third NMOS transistors N2 and N3 and the second and third PMOS transistors P2 and P3 may share the second gate line G2. The fourth and fifth NMOS transistors N4 and N5 and the fourth and fifth PMOS transistors P4 and P5, which are gated to the voltage level of the inverted first input signal X1, may be provided with the inverted first input signal X1 through the first gate line G1. The fourth and fifth NMOS transistors N4 and N5 and the fourth and fifth PMOS transistors P4 and P5 may share the first gate line G1.

The drain region of the second NMOS transistor N2 and the drain region of the second PMOS transistor P2 may be connected to each other through the source/drain contact CA, the contact line CM connected to the source drain contact CA, the first metal line M1 connected to the contact line CM through the contact via V0, and the second metal line M2 connected to the first metal line M1 through the first via V1 to output the first output signal Y1. Similarly, the drain region of the third NMOS transistor N3 and the drain region of the third PMOS transistor P3, the drain region of the fourth NMOS transistor N4 and the drain region of the fourth PMOS transistor P4, and the drain region of the fifth NMOS transistor N5 and the drain region of the fifth PMOS transistor P5 may be interconnected to the second metal line M2 to output the first output signal Y1.

The first to fourth circuits 100, 200, 300 and 400 placed on the first to fourth cells 11 to 14 of the semiconductor device according to some embodiments may be provided with input signals A1 to A4 from the first metal line M1 and may output the output signals Y1 to Y4 to the second metal line M2. That is, an input pin to which the input signals A1 to A4 of the first to fourth circuits 100, 200, 300 and 400 are input and an output pin from which the output signals Y1 to Y4 are output may be formed at different metal levels from each other and may be formed at a lower metal level than the input pin formed at the metal level of the first metal line M1 and the output pin formed at the metal level of the second metal line M2. Alternatively, unlike the shown example, the input pins and the output pins of the first to fourth circuits 100, 200, 300 and 400 placed on the first to fourth cells 11 to 14 of the semiconductor device according to some embodiments may be formed at the same metal level as each other. For example, the input pins and output pins may also be formed at the metal level of the first metal line M1.

Figure 15:
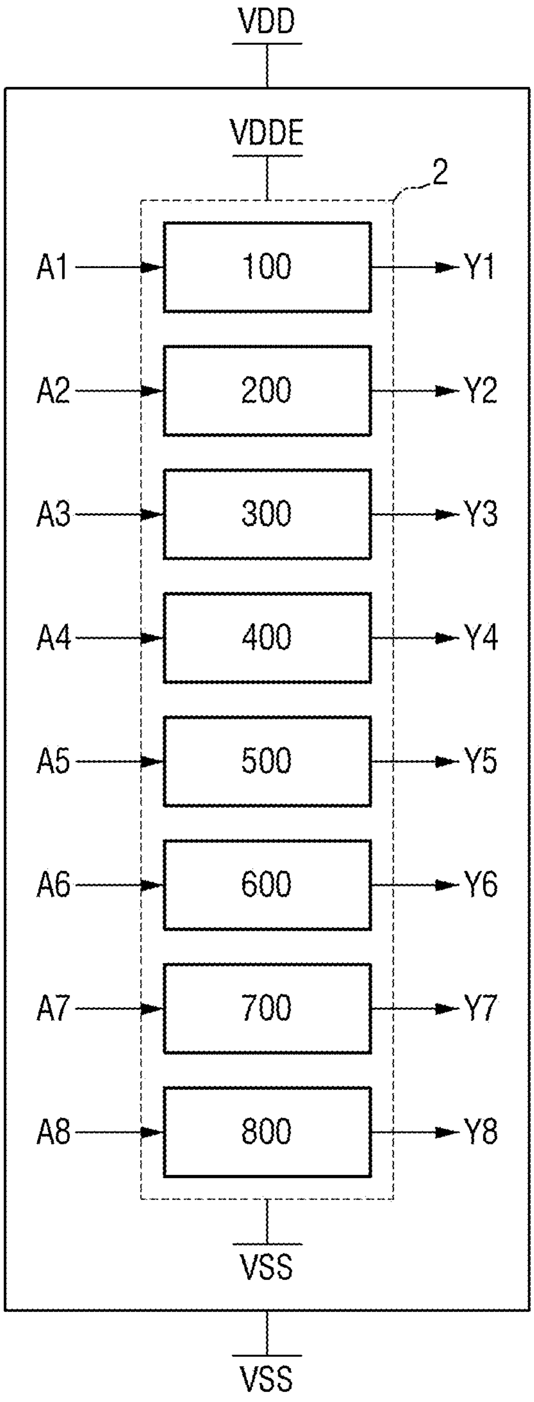
FIG. 15 is a block diagram of a semiconductor device according to some embodiments.

FIG. 15 is a block diagram of a semiconductor device according to some embodiments. For convenience of explanation, points different from FIG. 1 will be mainly explained.

Referring to FIG. 15, a circuit 2, which is provided with the third voltage VDDE to operate, included in the semiconductor device according to some embodiments may further include fifth to eighth circuits 500, 600, 700 and 800. The circuit 2 may process the input signals corresponding to each bit in parallel. The circuit 2 may process, for example, an input signal of 8 bits. Each of the first to eighth circuits 100, 200, 300, 400, 500, 600, 700 and 800 may receive the first to eighth input signals A1 to A8, respectively, corresponding to the first to eighth bits and respectively output the first to eighth output signals Y1 to Y8 corresponding to the first to eighth bits.

Figure 16:
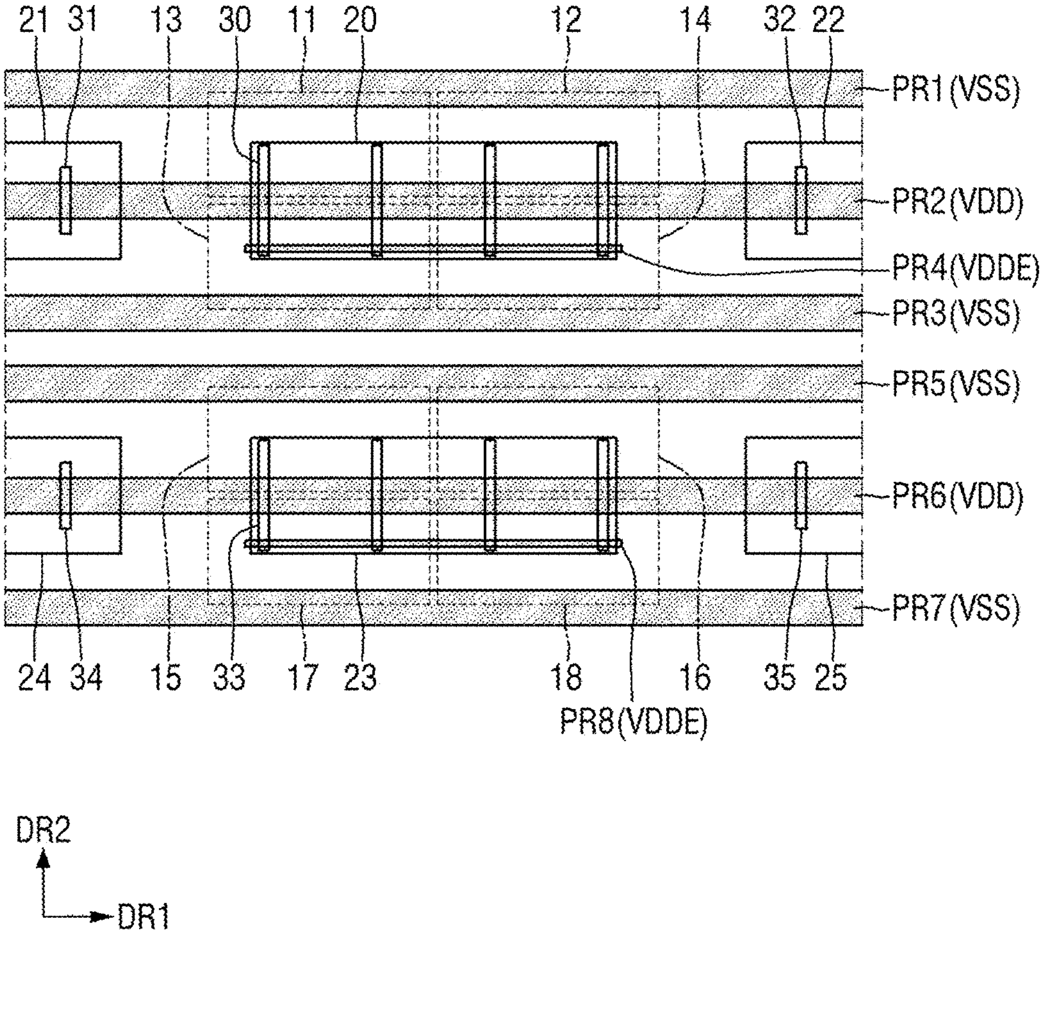
FIG. 16 is a layout diagram for explaining the circuit of FIG. 1.

FIG. 16 is a layout diagram for explaining the circuit of FIG. 1. For convenience of explanation, points different from FIG. 2 will be mainly explained.

Referring to FIG. 16, the circuit 2 may be formed on the semiconductor substrate. The fifth to seventh power rails PR5 to PR7 may extend in the first direction DR1. The fifth to seventh power rails PR5 to PR7 may be sequentially spaced apart from each other in the second direction DR2. The fifth power rail PR5 and the seventh power rail PR7 may be provided with the first voltage VSS, and the sixth power rail PR6 may be provided with a second voltage VDD different from the first voltage. For example, the first voltage VSS may be a ground voltage and the second voltage VDD may be a first supply voltage.

A fifth cell 15 and a sixth cell 16 may be continuously placed between the fifth power rail PR5 and the sixth power rail PR6. The fifth cell 15 and the sixth cell 16 may be arranged in the first direction DR1. The cell boundaries of the fifth cell 15 and the sixth cell 16 may be defined by the fifth power rail PR5 and the sixth power rail PR6.

A seventh cell 17 and an eighth cell 18 may be continuously placed between the sixth power rail PR6 and the seventh power rail PR7. The seventh cell 17 and the eighth cell 18 may be arranged in the first direction DR1. The cell boundaries of the seventh cell 17 and the eighth cell 18 may be defined by the sixth power rail PR6 and the seventh power rail PR7.

Each of the first to eighth circuits 100, 200, 300, 400, 500, 600, 700 and 800 may be placed, for example, in each of the first to eighth cells 11 to 18, respectively.

An eighth power rail PR8 may be placed between the fifth power rail PR5 and the seventh power rail PR7. The eighth power rail PR8 may extend in the first direction DR1. The eighth power rail PR8 may be spaced apart from the fifth power rail PR5 and the seventh power rail PR7 in the second direction DR2. The eighth power rail PR8 may be placed between the sixth power rail PR6 and the seventh power rail PR7 as shown in the drawings. Alternatively, the eighth power rail PR8 may also be placed between the fifth power rail PR5 and the sixth power rail PR6.

The eighth power rail PR8 may be placed on a second well 23. The eighth power rail PR8 may be provided with the third voltage VDDE. The third voltage VDDE may be a second supply voltage different from the second voltage VDD.

The second well 23 may be placed inside the semiconductor substrate between the fifth power rail PR5 and the seventh power rail PR7. The second well 23 may extend in the first direction DR1. The second well 23 may have a first conductive type. The first conductive type may be, for example, an N type.

A fourth connection line 33 may be connected to the eighth power rail PR8 and extend in the second direction DR2. The portion of the second well 23 connected to the fourth connection line 33 may be provided with the third voltage VDDE from the fourth connection line 33.

The fifth to eighth cells 15 to 18 may share the second well 23. At least some of fifth to eighth cells 15 to 18 may be placed on the second well 23. The PMOS transistors included in the fifth to eighth cells 15 to 18 may be placed on the second well 23. The PMOS transistors included in the fifth to eighth cells 15 to 18 may be connected to the fourth connection line 33, which is connected to the eighth power rail PR8, and may be provided with the third voltage VDDE.

A third dummy well 24 may be placed on one side of the second well 23. A fourth dummy well 25 may be placed on the other side of the second well 23. Here, one side and the other side of the second well 23 may be based on the first direction DR1. That is, the third dummy well 24, the second well 23, and the fourth dummy well 25 may be sequentially arranged in the first direction DR1. Therefore, the second well 23 may be isolated by the third dummy well 24 and the fourth dummy well 25.

A fifth connection line 34 may be connected to the eighth power rail PR8 and extend in the second direction DR2. The third dummy well 24 may be connected to the fifth connection line 34 and provided with the second voltage VDD. A sixth connection line 35 may be connected to the eighth power rail PR8 and extend in the second direction DR2. The fourth dummy well 25 may be connected to the sixth connection line 35 and provided with the second voltage VDD.

In the semiconductor device according to some embodiments, the first to fourth cells 11 to 14 may be placed to share the first well 20 and the fifth to eighth cells 15 to 18 may be placed to share the second well 23. Accordingly, because the number and/or area of the first and second wells 20 and 23 may decrease, and the number and/or area of dummy wells for isolating the first and second wells 20 and 23 may also decrease, the area of the semiconductor device may decrease.

Figure 17:
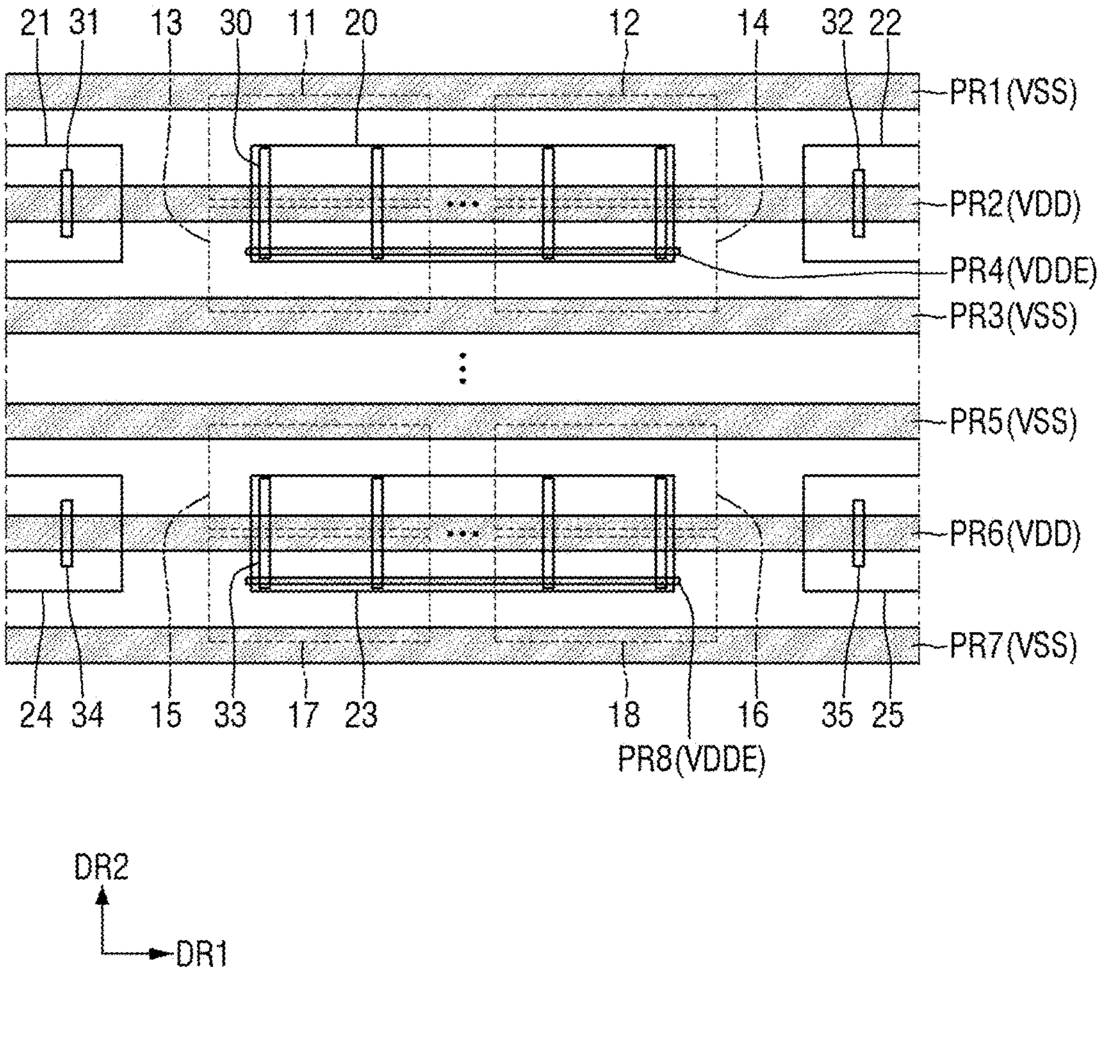
FIG. 17 is a layout diagram for explaining the semiconductor device according to some embodiments.

FIG. 17 is a layout diagram for explaining a semiconductor device according to some embodiments. For convenience of explanation, points different from FIG. 16 will be mainly explained.

Referring to FIG. 17, a semiconductor device may include a plurality of circuits that are provided with the third voltage VDDE to operate.

A plurality of cells arranged in at least two rows may be placed between the power rails that are provided with the first voltage VSS and are spaced in the second direction DR2. The plurality of cells may share a single well. The PMOS transistor included in the plurality of cells and placed on the well may be provided with the third voltage VDDE from the connection line connected to one power rail.

For example, the plurality of cells in which cell boundaries are defined by the first power rail PR1 and the second power rail PR2 may be continuously placed in the first direction DR1. The plurality of cells in which cell boundaries are defined by the second power rail PR2 and the third power rail PR3 may be continuously placed in the first direction DR2. The PMOS transistors included in the plurality of cells and placed on the first well 20 may be provided with the third voltage VDDE from the first connection line 30 connected to the single fourth power rail PR4. A plurality of circuits having the same structure as the circuit placed between the first power rail PR1 and the third power rail PR3 may be placed between the third power rail PR3 and the fifth power rail PR5.

Figure 18:
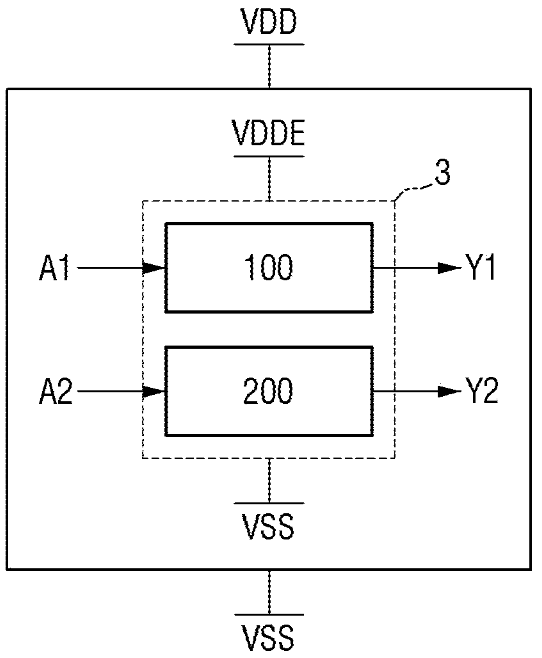
FIG. 18 is a block diagram of a semiconductor device according to some embodiments.
Figure 19:
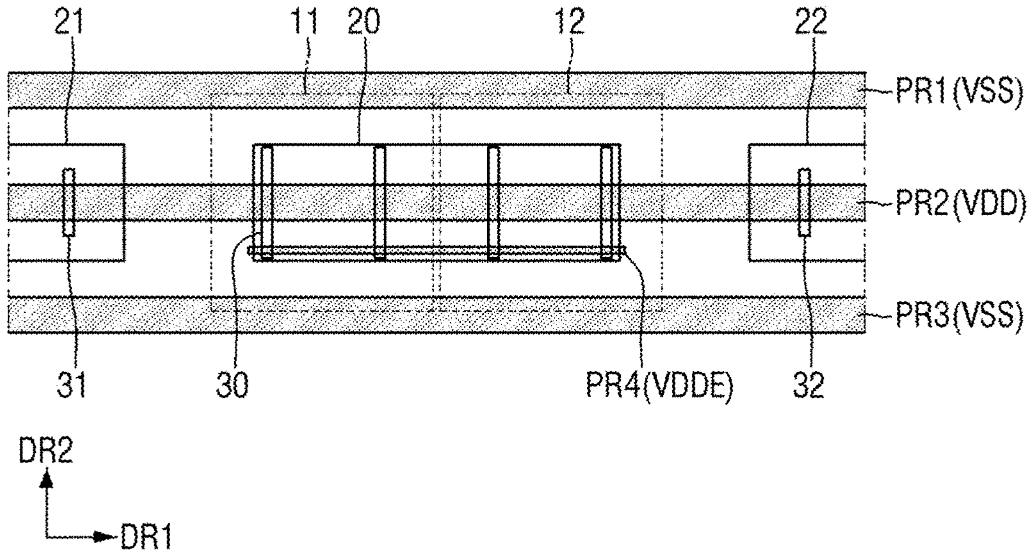
FIG. 19 is a layout diagram for explaining the circuit of FIG. 18.
Figure 20:
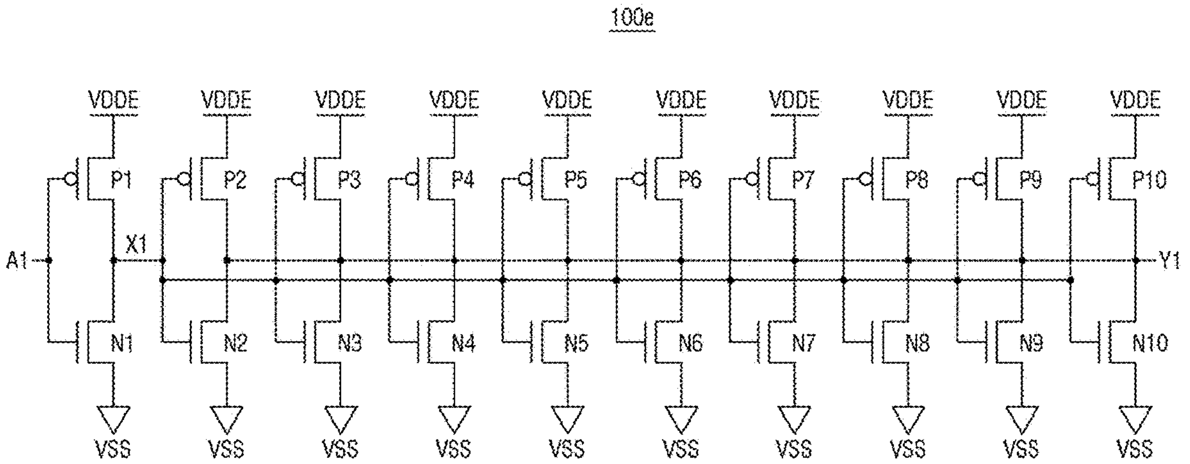
FIG. 20 is an exemplary circuit diagram of the first circuit of FIG. 18.

FIG. 18 is a block diagram of a semiconductor device according to some embodiments. FIG. 19 is a layout diagram for explaining the circuit of FIG. 18. FIG. 20 is an exemplary circuit diagram of the first circuit of FIG. 18. The first and second circuits 100 and 200 of FIG. 18 may have, for example, the same configuration, and FIG. 20 may be an exemplary circuit diagram of the first and second circuits 100 and 200 of FIG. 18. For convenience of explanation, points different from FIGS. 9 and 10 will be mainly described.

Referring to FIGS. 18 to 20, a circuit 3, which is provided with the third voltage VDDE to operate, included in the semiconductor device according to some embodiments may include the first and second circuits 100 and 200. The first circuit 100 may be placed in the first cell 11, and the second circuit 200 may be placed in the second cell 12.

A first circuit 100*e* may include a sixth PMOS transistor P6 and a sixth NMOS transistor N6, a seventh PMOS P7 and a seventh NMOS transistor N7, an eighth PMOS P8 and an eighth NMOS transistor N8, a ninth PMOS transistor P9 and a ninth NMOS transistor N9, a tenth PMOS transistor P10 and a tenth NMOS transistor N10, which are gated to the voltage level of the inverted first input signal X1 and connected in series between the third voltage VDDE and the first voltage VSS. That is, although the first circuit 100*e* may include ten pairs of NMOS transistors and PMOS transistors, which are gated to the voltage level of the inverted first input signal X1 and connected in series between the third voltage VDDE and the first voltage VSS, the present disclosure is not limited thereto.

The heights of the first and second cells 11 and 12 may be substantially the same as, for example, the heights of the first to fourth cells 11 to 14 of FIG. 9. Because the first and second cells 11 and 12 include more transistors than the number of transistors included in the first to fourth cells 11 to 14 of FIG. 9, the width of the second cell 11 and 12 may be smaller than, for example, the width of the first to fourth cells 11 to 14, but the present disclosure is not limited thereto.

Figure 21:
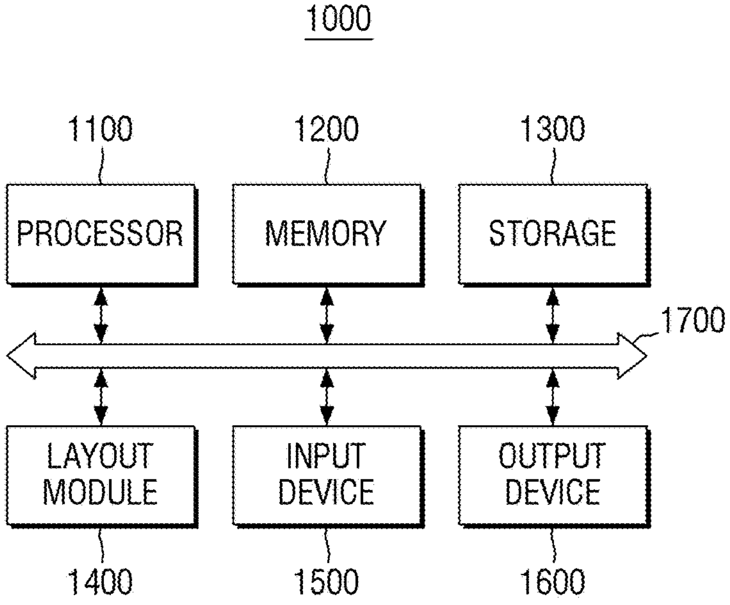
FIG. 21 is a block diagram for explaining a layout system of a semiconductor device according to some embodiments.

FIG. 21 is a block diagram for explaining a layout system of a semiconductor device according to some embodiments.

Referring to FIG. 21, a layout system 1000 of the semiconductor device may perform a layout on the semiconductor circuit.

The layout system 1000 includes a processor 1100, a memory 1200, a storage 1300, a layout module 1400, an input device 1500, and an output device 1600. The processor 1100, the memory 1200, the storage 1300, the layout module 1400, the input device 1500 and the output device 1600 may be electrically connected to each other through a bus 1700 to exchange data with each other. However, the scope of the present disclosure is not limited thereto, and depending on the specific purpose of implementation, the layout system 1000 may be implemented to omit some of the processor 1100, the memory 1200, the storage 1300, the layout module 1400, the input device 1500 and the output device 1600, or may be implemented to further include a device not shown in FIG. 21 (for example, a display device).

First, the layout module 1400 may perform the layout on the semiconductor circuit described herein. The layout module 1400 may be implemented by software, by hardware, or by a combination of software and hardware. When implemented by software, the layout module 1400 may include one or more instructions for performing the layout on the semiconductor circuits described herein. On the other hand, when implemented by hardware, the layout module 1400 may include, for example, one or more programmable electronic circuits for performing the layout on the semiconductor circuit described herein. On the other hand, a part of the layout module 1400 may be implemented by software, and at the same time, another part thereof may be implemented by hardware.

The layout module 1400 may layout one or more standard cell designs in accordance with defined requirements, for example, design rules, using the processor 1100. The standard cell designs may be stored in the storage 1300. The layout module 1400 may perform the layout on the circuit of the semiconductor device described above.

The processor 1100 controls the overall operation of the layout system 1000. In particular, the processor 1100 may control or execute the layout module 1400 to perform the layout on the semiconductor circuits described herein. In some embodiments of the present disclosure, although the processor 1100 may be implemented by a CPU (Central Processing Unit), a GPU (Graphic Processing Unit), or the like, the scope of the present disclosure is not limited thereto.

The memory 1200 provides a space which may store instructions, program codes, data, and the like required for the layout module 1400 to perform the layout on the semiconductor circuit described herein. In some embodiments of the disclosure, although the memory 1200 may be implemented by a volatile memory such as a DRAM (Dynamic Random Access Memory), and a SRAM (Static Random Access Memory), the scope of the disclosure is not limited thereto, and the memory 1200 may also be implemented by a non-volatile memory such as a flash memory.

When all or a part of the layout module 1400 is implemented by software, the storage 1300 may store the instructions or program codes, store data required for the layout module 1400 to perform the layout on the semiconductor circuit described herein, or store layout-related data such as constraints such as design rules, data of various elements used in the layout of the semiconductor circuit, and standard cell data. In some embodiments of the present disclosure, although the storage 1300 may be implemented by an SSD (Solid State Drive), an HDD (Hard Disk Drive), or the like, the scope of the present disclosure is not limited thereto. The storage 1300 may be implemented by non-transitory computer readable medium.

The layout system 1000 may receive layout-related data from a user or another device implemented inside/outside the layout system 1000 by use of the input device 1500 and may transmit layout-related data, stored data, result data, or the like to a user or another device implemented inside/outside the layout system 1000 by use of the output device 1600.

As is traditional in the field, embodiments may be described and illustrated in terms of blocks which carry out a described function or functions. These blocks, which may be referred to herein as units or modules or the like, are physically implemented by analog and/or digital circuits such as logic gates, integrated circuits, microprocessors, microcontrollers, memory circuits, passive electronic components, active electronic components, optical components, hardwired circuits and the like, and may optionally be driven by firmware and/or software. The circuits may, for example, be embodied in one or more semiconductor chips, or on substrate supports such as printed circuit boards and the like. The circuits constituting a block may be implemented by dedicated hardware, or by a processor (e.g., one or more programmed microprocessors and associated circuitry), or by a combination of dedicated hardware to perform some functions of the block and a processor to perform other functions of the block. Each block of the embodiments may be physically separated into two or more interacting and discrete blocks without departing from the scope of the disclosure. Likewise, the blocks of the embodiments may be physically combined into more complex blocks without departing from the scope of the disclosure. An aspect of an embodiment may be achieved through instructions stored within a non-transitory storage medium and executed by a processor.

In concluding the detailed description, those skilled in the art will appreciate that many variations and modifications may be made to the preferred embodiments without substantially departing from the principles of the present disclosure. Therefore, the disclosed preferred embodiments of the disclosure are used in a generic and descriptive sense only and not for purposes of limitation.

What is claimed is:

1. A semiconductor device comprising:

a first power rail, a second power rail, and a third power rail which extend in a first direction on a semiconductor substrate and are sequentially spaced apart from each other in a second direction intersecting the first direction;

a single fourth power rail which extends in the first direction on the semiconductor substrate between the first power rail and the third power rail;

a first well of a first conductive type which is displaced inside the semiconductor substrate between the first power rail and the third power rail;

a plurality of first cells in which cell boundaries are defined by the first power rail and the second power rail and which are placed continuously; and a plurality of second cells in which cell boundaries are defined by the second power rail and the third power rail and which are placed continuously, wherein:

the first power rail and the third power rail are provided with a first voltage, the second power rail is provided with a second voltage that is different from the first voltage, the single fourth power rail is provided with a third voltage that is different from the first voltage and the second voltage, and the plurality of first cells and the plurality of second cells share the first well and are provided with the third voltage from the single fourth power rail.

2. The semiconductor device of claim 1, further comprising:

a contact line connected to the single fourth power rail and extending in the second direction, below the single fourth power rail, wherein each of the plurality of first cells and the plurality of second cells are connected to the contact line and provided with the third voltage.

3. The semiconductor device of claim 1, wherein each of the plurality of first cells and each of the plurality of second cells include an inverter, a circuit which performs a NAND computation, or a circuit which performs an NOR computation.

4. The semiconductor device of claim 1, wherein each of the plurality of first cells and each of the plurality of second cells include a plurality of inverters.

5. The semiconductor device of claim 1, further comprising:

a first dummy well of the first conductive type displaced on one side of the first well and spaced apart from the first well in the first direction; and a second dummy well of the first conductive type displaced on the other side of the first well and spaced apart from the first well in the first direction.

6. The semiconductor device of claim 5, wherein the first dummy well and the second dummy well are provided with the second voltage from the second power rail.

7. The semiconductor device of claim 1, further comprising:

a fifth power rail, a sixth power rail, and a seventh power rail which extend in the first direction and are sequentially spaced apart from each other in the second direction on the semiconductor substrate;

a single eighth power rail which extends in the first direction on the semiconductor substrate between the fifth power rail and the seventh power rail;

a second well of the first conductive type which is displaced inside the semiconductor substrate between the fifth power rail and the seventh power rail;

a plurality of third cells in which cell boundaries are defined by the fifth power rail and the sixth power rail and which are displaced continuously; and a plurality of fourth cells in which cell boundaries are defined by the sixth power rail and the seventh power rail and which are displaced continuously, wherein:

the fifth power rail and the seventh power rail are provided with the first voltage, the sixth power rail is provided with the second voltage, the single eighth power rail is provided with the third voltage, and the plurality of third cells and the plurality of fourth cells share the second well and are provided with the third voltage from the single eighth power rail.

8. A semiconductor device comprising:

a first power rail, a second power rail, and a third power rail which extend in a first direction on a semiconductor substrate and are sequentially spaced apart from each other in a second direction intersecting the first direction;

a single fourth power rail which extends in the first direction on the semiconductor substrate between the first power rail and the third power rail;

a first well of a first conductive type which is displaced inside the semiconductor substrate between the first power rail and the third power rail; and a plurality of cells which are arranged between the first power rail and the third power rail in two rows and share the first well, wherein:

the first power rail and the third power rail are provided with a first voltage, the second power rail is provided with a second voltage that is different from the first voltage, the single fourth power rail is provided with a third voltage that is different from the first voltage and the second voltage, each of the plurality of cells includes a transistor of a second conductive type displaced on the first well, and the transistor is provided with the third voltage from the single fourth power rail.

9. The semiconductor device of claim 8, further comprising:

a second metal line connected to the single fourth power rail and extending in the second direction;

a first metal line connected to the second metal line and extending in the first direction;

a contact line connected to the first metal line and extending in the second direction; and a source/drain contact which is connected to the contact line and is displaced in a source/drain region of the transistor displaced on the first well, wherein the source/drain region of the transistor is provided with the third voltage from the source/drain contact.

10. The semiconductor device of claim 8, wherein the first conductive type is N-type, and the second conductive type is P-type.

11. The semiconductor device of claim 8, wherein a metal level of an input pin of each of the plurality of cells is different from a metal level of an output pin of each of the plurality of cells.

12. The semiconductor device of claim 8, wherein a metal level of an input pin of each of the plurality of cells is lower than a metal level of an output pin of each of the plurality of cells.

13. The semiconductor device of claim 8, wherein a metal level of an input pin of each of the plurality of cells is same as a metal level of an output pin of each of the plurality of cells.

14. The semiconductor device of claim 8, wherein the plurality of cells includes a first cell, a second cell, a third cell and a fourth cell, wherein the first cell and the second cell are adjacent to each other in the first direction between the first power rail and the second power rail, wherein the third cell and the fourth cell are adjacent to each other in the first direction between the second power rail and the fourth power rail, wherein the first cell and the third cell are adjacent to each other in the second direction, and wherein the second cell and the fourth cell are adjacent to each other in the second direction.

15. A semiconductor device comprising:

a first power rail and a third power rail that extend parallel to one another in a first direction on a semiconductor substrate, are sequentially spaced apart from each other in a second direction intersecting the first direction, and are provided with a first voltage;

a second power rail that extends parallel to, and is disposed between, the first power rail and the third power rail and is provided with a second voltage differing from the first voltage;

a fourth power rail that is disposed between the second power rail and one of the first power rail and the third power rail and is provided with a third voltage differing from the first voltage and the second voltage; and logic cells disposed between the first power rail and the third power rail that receive the third voltage from the fourth power rail.

16. The semiconductor device of claim 15, further comprising a well of a first conductive type that is shared by all of the logic cells.

17. The semiconductor device of claim 16, wherein the well is displaced inside the semiconductor substrate between the first power rail and the third power rail.

18. The semiconductor device of claim 17, wherein a first portion of each of the logic cells is disposed between the first power rail and the second power rail and a second portion of each of the logic cells is disposed between the second power rail and the third power rail.

19. The semiconductor device of claim 17, wherein:

a first logic cell, among the logic cells, is disposed between the first power rail and the second power rail and does not extend into a space between the second power rail and the third power rail, and a second logic cell, among the logic cells, is disposed between the second power rail and the third power rail and does not extend into a space between the first power rail and the second power rail.

20. The semiconductor device of claim 15, wherein the fourth power rail extends parallel to the first, second, and third power rails along the first direction.

* * * * *